United States Patent
Mallon et al.

(10) Patent No.: US 10,997,349 B1
(45) Date of Patent: May 4, 2021

(54) INCREMENTAL CHAINING IN THE PRESENCE OF ANCHORED FIGURES

(71) Applicant: Cadence Design Systems, Inc., San Jose, CA (US)

(72) Inventors: David Mallon, Aberdour (SC); Gilles Lamant, Sunnyvale, CA (US); Kenneth Ferguson, Edinburgh (GB); Christopher Stewart, Edinburgh (GB); Kenneth Mackie, Edinburgh (GB)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 16/693,606

(22) Filed: Nov. 25, 2019

(51) Int. Cl.
*G06F 30/392* (2020.01)
*G06F 30/398* (2020.01)

(52) U.S. Cl.
CPC .......... *G06F 30/392* (2020.01); *G06F 30/398* (2020.01)

(58) Field of Classification Search
USPC ........................................................ 716/119
See application file for complete search history.

(56) References Cited

U.S. PATENT DOCUMENTS

| | | | |
|---|---|---|---|
| 2012/0079439 A1* | 3/2012 | Akar | G06F 30/398 716/106 |
| 2019/0042684 A1* | 2/2019 | Toub | G06F 30/36 |

\* cited by examiner

*Primary Examiner* — Bryce M Aisaka
(74) *Attorney, Agent, or Firm* — Tarolli, Sundheim, Covell & Tummino LLP

(57) ABSTRACT

In the context of electronic design automation and particularly circuit layout design software tools, systems and methods for incremental chaining of circuit devices (or, more generally, "figures," which can include instances and pins) permit user-interactive abutment and placement. Selection of one or more anchor figures highlights chaining candidates which can be automatically chained to the anchor figure(s) upon selection, as with a single mouse click. As compared to manual interactive abutment or automatic batch-mode chaining, incremental chaining offers improved usability, reduced manual effort, and the opportunity for user interaction as a chain is constructed, because the user is permitted interventions at any point in the chaining process for altering device parameters or characteristics.

20 Claims, 6 Drawing Sheets

CREATION OF SOLUTION 2: STEP 1

CREATION OF SOLUTION 2: STEP 2

CREATION OF SOLUTION 2: STEP 3

CREATION OF SOLUTION 2: STEP 4

CREATION OF SOLUTION 2: STEP 5

INCREMENTAL CHAINING IN THE PRESENCE OF ANCHORED FIGURES

TECHNICAL FIELD

The present invention relates generally to the field of electronic design automation for circuit design, and specifically to methods and systems for incremental chaining in the presence of anchored figures.

BACKGROUND

Semiconductor-based integrated circuits (ICs) can be highly complex, containing millions of circuit devices, such as transistors, and millions of interconnections between the circuit devices. Designing such complex circuits cannot be accomplished without the aid of computerized tools. Circuit designers use computer-based electronic design automation (EDA) tools for schematics, layouts, simulation, and verification of the complex circuits. EDA tools allow circuit designers to optimize complex electronic circuits, for example, by reducing the footprints of the various circuit devices. Designers rely on EDA tools to reduce the footprint of circuit devices by keeping them closer together to make use of chip area more efficiently.

An EDA tool can assist in optimizing an IC design by forming a chain of abutted layout devices to reduce the device footprint of the layout devices. The EDA tool can pack the layout devices closer together or merge the layout devices by abutting them, thereby saving valuable semiconductor space in the IC. For example, the EDA tool may detect that two layout devices are sufficiently close together to be abutted and may trigger an abutment process based on such detection. The EDA tool may then form chain of abutted layout devices, wherein successive layout devices are abutted to each other to form a linear chain.

The process of chaining thus involves the abutment of layout figures to form optimized chains. Conventionally, chaining is a batch-mode operation, with all layout figures to be chained being selected before a chaining command is invoked to execute a chaining algorithm. The chaining algorithm operates to chain the selected multiple layout figures. A chain generated by the chaining algorithm may then be placed by a user (e.g., a human circuit designer or engineer) upon completion of the chaining algorithm.

SUMMARY

One example includes a computer-implemented method for interactive incremental chaining of circuit devices in an integrated circuit. One or more files containing database records of a plurality of circuit layout figures, including circuit devices and/or pins, and connectivity information comprising a plurality of nets interconnecting at least a portion of the plurality of circuit layout figures, are received, e.g., by a computer. One or more circuit layout figures, placed on a layout canvas rendered by a graphical user interface, are selected with the graphical user interface as one or more anchor figures. One or more chaining candidate figures from among the plurality of circuit layout figures directly or indirectly connected to the one or more anchor figures are highlighted on the graphical user interface, based on the connectivity information and the selection of the one or more anchor figures. Responsive to a selection of one or more of the chaining candidate figures, the selection of the one or more chaining candidate figures is chained with the one or more anchor figures by sequentially abutting the selected one or more chaining candidate figures and any intervening connected figures with the one or more anchor figures. After the chaining, the highlighting, the selection of chaining candidate figures, and the chaining are repeated to progressively build and place on the layout canvas one or more chains of the plurality of circuit layout figures.

Another example includes a system for user-interactive incremental chaining of circuit devices in an integrated circuit. One or more computers have a non-transitory machine-readable media configured to store one or more files containing database records of a plurality of circuit layout figures, including circuit devices and/or pins, and connectivity information comprising a plurality of nets interconnecting at least a portion of the plurality of circuit layout figures. At least one computer of the one or more computers is coupled to the non-transitory machine-readable media storing the one or more files and has a processor configured to permit a user to select one or more circuit layout figures, placed on a layout canvas rendered by a graphical user interface, as one or more anchor figures. The processor is further configured to highlight, on the graphical user interface, one or more chaining candidate figures from among the plurality of circuit layout figures directly or indirectly connected to the one or more anchor figures, based on the connectivity information and the user selection of the one or more anchor figures. The processor is further configured to permit the user to select one or more of the chaining candidate figures. The processor is further configured to, responsive to the user selection of the one or more of the chaining candidate figures, automatically chain the selected one or more chaining candidate figures with the one or more anchor figures by sequentially abutting the selected one or more chaining candidate figures and any intervening connected figures with the one or more anchor figures. The chaining preserves the placement of the one or more anchor figures. The intervening connected figures, if any, are in a connectivity path between the one or more anchor figures and the one or more chaining candidate figures according to the connectivity information. The processor is further configured to, after the automatic chaining, user-interactively repeat the highlighting, the user selection of chaining candidate figures, and the automatic chaining to progressively build and place on the layout canvas one or more chains of the plurality of circuit layout figures.

Yet another example includes one or more computer-readable media configured to provide a computer as the system set forth above, or to execute in conjunction with a computer the method set forth above. Such an example can include one or more non-transitory computer-readable media storing instructions that, when executed by a processor, cause the processor to render a layout canvas on a graphical user interface, permit a user to select one or more circuit layout figures, placed on the layout canvas, as one or more anchor figures, and highlight, on the graphical user interface, one or more chaining candidate figures from among the plurality of circuit layout figures directly or indirectly connected to the one or more anchor figures, based on the connectivity information and the user selection of the one or more anchor figures. The instructions further cause the processor to permit the user to select one or more of the chaining candidate figures, and, responsive to this user selection, automatically chain the selected one or more chaining candidate figures with the one or more anchor figures by sequentially abutting the selected one or more chaining candidate figures and any intervening connected figures with the one or more anchor figures. The chaining preserves the placement of the one or more anchor figures.

The intervening connected figures, if any, are in a connectivity path between the one or more anchor figures and the one or more chaining candidate figures according to the connectivity information. The instructions further cause the processor to, after the automatic chaining, user-interactively repeat the highlighting, the user selection of chaining candidate figures, and the automatic chaining to progressively build and place on the layout canvas one or more chains of the plurality of circuit layout figures.

DETAILED DESCRIPTION

Figure 1:
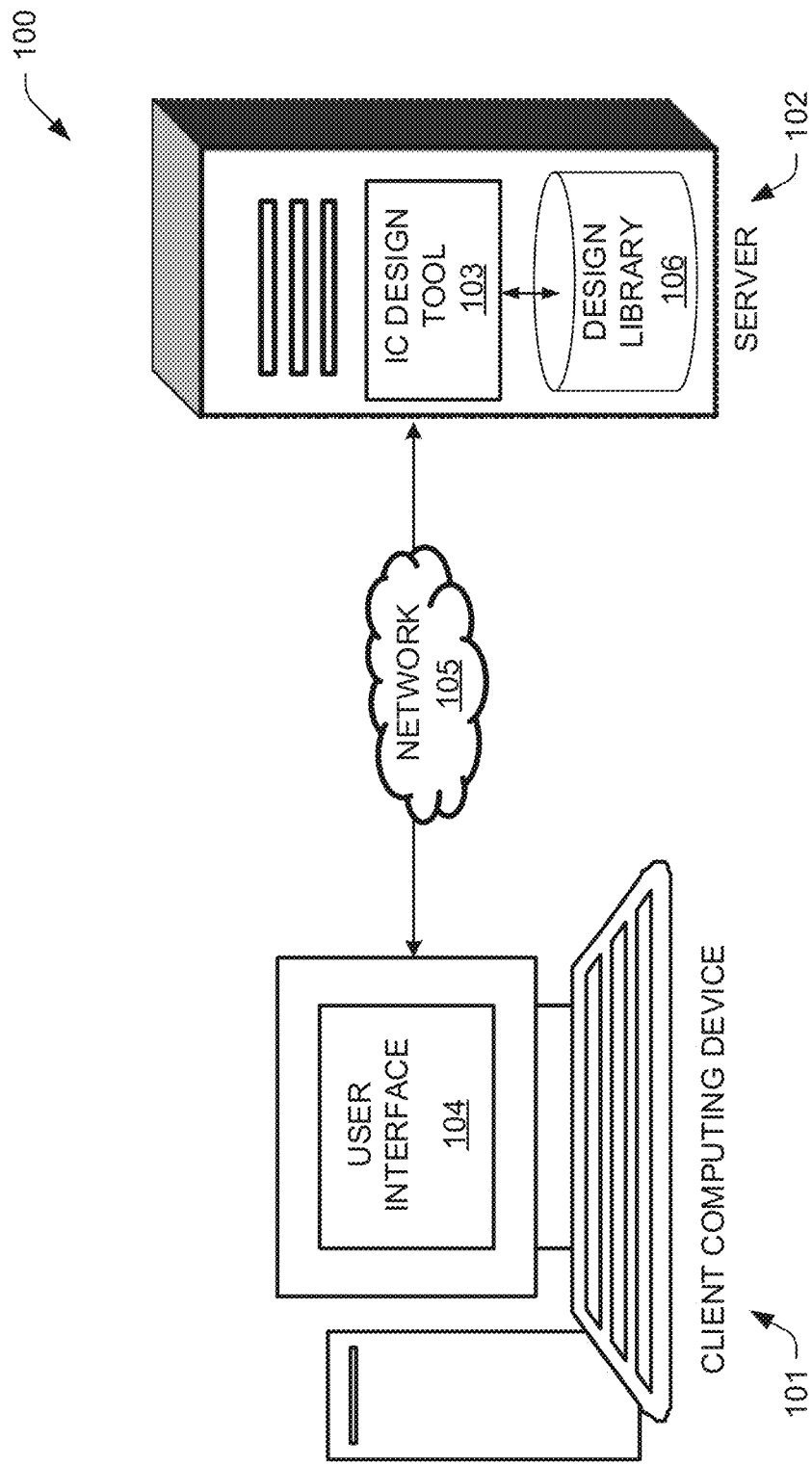
FIG. 1 is a block diagram of an example system for generating incremental chains of layout devices in the presence of anchored figures.

Examples of the systems and methods described herein provide incremental chaining of layout devices in the presence of anchored figures in the context of an electronic design automation (EDA) tool, and in particular a connectivity-aware IC layout tool. Connectivity awareness refers to the property that the layout tool has access to a netlist describing the connection relationships between circuit figures to be placed in a layout, which information can be derived, for example, from a circuit design schematic that provides topological information about circuit connectivity but not necessarily layout or placement information about the elements that make up the circuit. In contrast to a schematic, in which circuit components are represented only symbolically, components in a layout are accurately representative of components to be fabricated, in terms of their size (e.g., length) and other parameters.

A "figure," as used herein, refers to an instance or a pin in a circuit layout design. Examples of these include transistors and connector pins, respectively. "Abutment" refers to the merger and optimization of two spatially adjoining figures, or one figure and abutted multiple other figures. "Chaining," as used herein, refers to the spatial adjoinment, merger, and optimization of at least two, and typically more than two, figures by sequential abutment. As used herein, "chaining" does not refer merely to the connection of devices by wires, even though a chaining process can include or be followed by such wire connection. "Incremental chaining," as used herein, describes a user-computer interactive process of layout of figures that is semi-automated and user-interactive rather than fully automated, building up chains and abutting figures progressively based on user input, such as a series of single mouse-clicks to select figures to be added to a chain.

The incremental chaining systems and methods described herein are invoked in the context of layout design, when the connections between circuit devices (in the context of electronic devices, by fabricated wires or by abutment of the devices) are already known to the EDA computer system, and hence potentially also to the user, as described by device connectivity data, e.g., one or more netlists, as may be described by a hardware description language such as Verilog.

When two circuit devices of known connectivity are brought together in a graphical user interface of a circuit layout design, they can undergo a process of abutment, wherein the shapes of each of the individual devices are merged and optimized, in part by optimizing their interfaces to other circuit devices, sometimes by eliminating unnecessary interfaces, thereby potentially reducing the total number of interfaces, and potentially taking up less footprint area on an IC. For example, it is often not necessary to have contacts between abutted devices, so these can in some cases be dropped in the abutment process, saving space. It may also be that other changes to device geometry take place when two devices are abutted. All of these abutment modifications and optimizations are encoded in an abutment function, which can be written, for example, in a description language such as Cadence SKILL, typically by those with intimate knowledge of the manufacturing process used in fabrication of the ICs undergoing layout.

The process of chaining can involve many abutments performed in sequence, although, as demonstrated in FIGS. 6-10, in some examples, chaining can result in multiple chains connected to each other by wires such that not all of the devices intended to be chained necessarily abut with each other. Abutment can be done interactively, for example by a user moving (as by clicking and dragging with a mouse input device) device B towards device A or vice-versa. Chaining is conventionally done by selecting a number of devices and invoking an automatic, non-interactive chaining algorithm (e.g., by a user mouse-clicking a screen-rendered button in a graphical user interface, or entering a keyboard shortcut on a keyboard) to chain together the selected devices. Successful execution of the chaining algorithm results in some or all of the selected devices being abutted to each other, optimizing their interfaces, and, in some examples, optimizing the positions or orientations of devices, or adding on extra circuit material, to give a final chaining solution.

Incremental chaining, as described herein, exploits known net connections to interactively build chains without resorting to automatic chaining algorithms that can disadvantageously exclude the user from the design and placement process. In incremental chaining, a user can select one or more devices, or more generally, figures, as one or more anchor figures, whereupon the EDA computer system can examine the connectivity of the one or more anchor devices to determine the anchor figure's (or figures') neighbor figure(s), connected to the anchor figure(s) by nets, and thereby to recognize these neighbor figure(s) as candidates for abutment to the anchor figure(s). This connectivity can be visually highlighted to the user via the user interface of the EDA tool, giving the user a visual indication of which candidate figure(s) can be abutted to the anchor figure(s). Then, a simple user input, such as a single mouse-click on one of the candidate figure(s), causes the EDA computer system to execute abutment of the selected candidate figure(s) with the originally-selected anchor figure(s), while at the same time keeping the originally-selected anchor figure in its original position (or group of originally-selected anchor figures in their original positions). By this incremental chaining, the user is saved the effort of having to perform user interface operations, such as mouse-clicks-and-drags, to bring figures together to form abutments. The elimination of mouse dragging (or other user interface operation, such as keyboard-entered positioning commands) saves user time and energy and potentially disorder-contributing stress of repetitive body motions. Also, typically, in order to form an abutment, pins of devices to be abutted have to be more or less perfectly overlapped at the completion of the movement of one device toward another. The elimination of the need for accurate user positioning of figures at the completion of a drag (or other user interface operation, such as keyboard-entered positioning commands) in order to form an abutment therefore further saves a user from the frustration of failed abutments that may result from inaccurately completed figure movements within the EDA tool's graphical user interface.

As described herein, incremental chaining also addresses disadvantages of batch-mode chaining. In batch-mode chaining, when a user has positioned one or more figures, any chaining that subsequently includes these positioned figure(s) will potentially re-position them at a different location, undoing the user's previous circuit design work. Batch-mode chaining provides no opportunity to select anchored devices that should retain their positions. Moreover, batch-mode chaining offers little or no interaction between the chaining algorithm and the user, meaning that no opportunity for human guidance on chaining candidate selection arises after the chaining command is invoked and executed. Consequently, invocation of a chaining algorithm to chain a large number of figures together in batch-mode chaining can result in a "spaghetti mess" of chained figures that fails to correspond to the user's intended layout design and provides the user little ability to re-order the chaining to "clean up" the resultant mess without extensive additional manual layout work. Incremental chaining, by contrast, permits a user to visually see the layout consequences of device abutment in any individual chaining operation, and to see a chain evolving with a series of simple interactive user inputs (e.g., single mouse clicks), which is fast, intuitive, user-driven, visually engaging, and permissive of corrective interventions at any point within the chaining process.

Additionally, as compared to manual user abutment of individual pairs of devices by interactively moving them, incremental chaining is significantly less laborious and, whereas manual user abutment provides no guidance with respect to which figures are candidates for abutment by virtue of their shared connectivity, incremental chaining makes such guidance visually apparent to the user by highlighting chaining candidates within the EDA tool's graphical user interface following selection of one or more anchor figures.

Accordingly, when chaining multiple layout figures together, e.g., forming abutments between the figures, circuit designer productivity is greatly improved by the chaining process being done incrementally, taking into account those parts of the circuit that have already been placed and abutted, and those connected parts which have still to be placed. The present application describes methods and systems providing such incremental interactive chaining, which gives a user immediate feedback as chaining progresses and which respects identified anchor figures. Feedback is given through visual updating of the chained figures as presented through a graphical user interface, and through highlighting of the nets belonging to the anchor and its chained figures. This feedback guides the user to click on further connected figures to be added to the chain, thus building a chain in an incremental process.

FIG. 1 illustrates an example electronic design automation (EDA) system 100.

The electronic design automation system 100 can include any number of computing devices; the illustrated example includes a client computing device 101 and a server 102. One or more components of the electronic design automation system 100 can be grouped and referred to as an electronic design automation tool (or EDA tool). The client 101 can be connected to the server 102 via hardware and software components of one or more networks 105. In some examples, the system 100 can be a cloud-based system wherein one or more functionalities of the system 100 are performed by one or more cloud-computing devices. Network 105 can also connect various computing devices with databases or other components of the system 100. Examples of network 105 include a local area network (LAN), a wireless local area network (WLAN), a metropolitan area network (MAN), a wide area network (WAN), and the Internet. The communication over network 105 can be performed in accordance with various communication protocols, such as Transmission Control Protocol and Internet Protocol (TCP/IP), User Datagram Protocol (UDP), and IEEE communication protocols.

Client device 101 can be any computing device comprising a processor, microcontroller and/or any other electronic component that performs one or more operations according to one or more programming instructions. Examples of computing device 101 include a desktop computer, a laptop, a personal digital assistant (PDA), a smartphone, and a tablet computer. Client device 101 can be equipped with user input devices, such as a keyboard and/or a pointing device, such as a mouse, touchpad, or trackball (not shown). Additionally or alternatively, client device 101 can include a touchscreen as a user input. Client device 101 can be configured to communicate with one or more servers 102 of the system 100 through one or more networks 105, using wired and/or wireless communication. User interface 104 can include a graphical user interface (GUI) that renders an interactive, graphical representation of an IC design, layout, schematic, or other logical representation of an IC that is being designed and optimized using an IC design tool 103. The user interface 104 can provide interactive elements, such as graphical representations of IC design elements (e.g., pcell instances), for a user to manipulate the IC design layout. The user interface 104 can also include a text-based interface allowing the user to enter manual commands for designing and optimizing the IC.

Server 102 can be accessible to client device 101 via one or more networks 105. Server 102 can be any computing device comprising a processor and other computing hardware configured to execute an IC design tool 103 software module (e.g., EDA design software) that can analyze and optimize an IC design. In operation, using a client device 101 to access a design tool 103 hosted on a server 102 over a network 105, a user can interact with the IC design tool 103 through a number of input devices of the client device 101, such as by inputting a selection as with a mouse or inputting a request as with a keyboard. The IC design tool 103 can generate any number of graphical interface 104 responses based on the inputs received from the client device 101, and then send the data back to the client device 101 to be rendered on the user interface 104.

The server 102 can execute one or more component software modules of the IC design tool 103 software program, which may be a software program that allows users to design and optimize circuit designs through software modules. The IC design tool 103 can provide users with interactive design interfaces 104 for designing an IC and the various design elements, execute automated optimization processes, and execute automated layout-generation processes. Server 102 can comprise, or may be in networked communication with, non-transitory machine-readable media configured to store a netlist of or any other file including records of IC design elements, which may be a machine-readable computer file or a design database containing one or more records of design elements (e.g., circuit devices, pcells) of the IC design. In operation, the IC design tool 103 can analyze and optimize the design elements of the netlist or any other type of file associated with the IC design. Non-limiting examples of circuit devices may include memory devices (e.g., flops), combination logic gates (e.g., AND, OR, NOT, NOR, NAND, XOR), and multiplexers, among others. The netlist or any other type of file may also include records of a plurality of nets. The nets may be the records associated with the wires interconnecting the plurality of circuit devices.

Server 102 can include a design library 106 that is accessed by the IC design tool 103. The design library 106 can include instances of various circuit devices, for example, transistors used to layout an IC. In some embodiments, the design library 106 can include instances of pcells used by the IC design tool 103 to generate an IC layout. An instance of a pcell may represent electronic circuit components such as a transistor, transmission line, or an optical fiber line. The instances of pcells can be connected through pins. For example, for a transistor pcell instance, the pins connecting the transistor pcell to other pcells in the design can be a source pin, a drain pin, and a gate pin. A pin can include one or more connecting shapes, called pin figures. As examples, for the transistor pcell instance, a pin figure for the source pin can be rectangular. For optical fibers and transmission lines, a pin figure for the pins interconnecting the segments of the optical fibers and the transmission lines can be circular. The IC design tool 103 can use instances of pcells in the design library 106 to generate a netlist of an IC that can be sent to a manufacturing facility for fabrication.

The example system 100 is shown in FIG. 1 as comprising only one server 102 for ease of explanation. However, system 100 can comprise a number of servers 102. For example, the system 100 can comprise multiple interconnected, networked servers 102, some of which can execute various software modules configured to manage and control the resources and performance of the system 100. In some examples, the servers 102 can have parallel architectures configured to support multi-threading on multi-core workstations to handle large designs. In such examples, the servers 102 can be configured for distributed processing. The server 102 can be logically and physically organized within the same or different devices or structures, and may be distributed across any number of physical structures and locations (e.g., cabinets, rooms, buildings, cities).

In operation, the example system 100 can group the circuit devices according to their types. For example, for example, system 100 can generate a first set of circuit devices containing transmission line instances and a second set of circuit devices containing photonic waveguide instances. For each set, system 100 can solve two-dimensional chaining problems involved in incremental chaining separately: system 100 can generate one or more two-dimensional chains of the transmission line instances and then separately generate one or more two dimensional chains of photonic waveguide instances. To generate the one or more two-dimensional chains, system 100 can iteratively abut circuit devices of the same type based upon connectivity and using the schematic orientation information, along with any interactive user input provided as part of the incremental chaining process.

Figure 2:
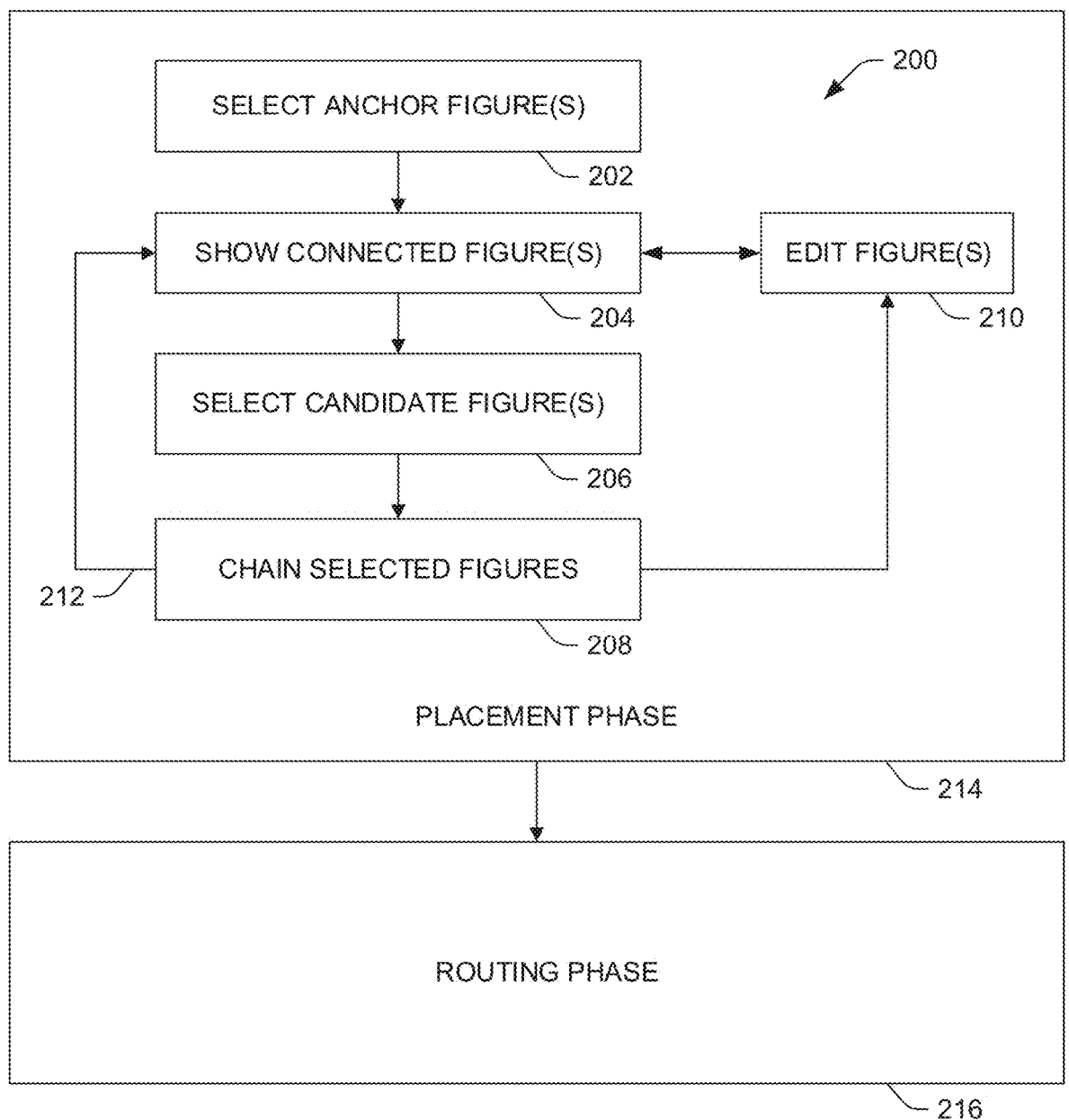
FIG. 2 is a flowchart illustrating a computer-implemented method of incremental chaining.

FIG. 2 illustrates a method 200 of incremental chaining within a placement phase 214 that user-interactively solves for the positions and orientations of devices and abuts them wherever possible. A separate routing phase 216 routes wires between those connected devices not chained in the placement phase 214, routing those wires necessary to respect the netlist after chaining. The method 200 assumes known connectivity information between figures to be placed, or which have already been placed within a layout canvas at positions and orientations that do not necessarily correspond to their intended final placement within the layout. On initial selection 202 of one or more figures on the layout canvas as anchor figures, which may, for example, be instances or pins, the user may invoke the incremental chaining feature on the selected figures. Such invocation may be performed, for example, by pressing a graphically-rendered button in the user interface 104, or via a keyboard shortcut. Alternatively, the incremental chaining functionality may have been so enabled prior to the initial figure selection 202.

Anchor figures may be instances, such as electronic transistors or photonic waveguides or pin figures providing inputs and outputs to and from the device under design. Anchors form the seed or starting point for a chain, and will not be moved in position or orientation by the incremental chaining. Where an anchor is already abutted, the abutted cluster of figures form an anchor that will not be displaced during the chaining process. Several independent anchors could also be selected to seed multiple chains. Each chain is built around its anchor by incrementally following the connectivity as outlined in the chaining flow diagram 200.

Figure 3:
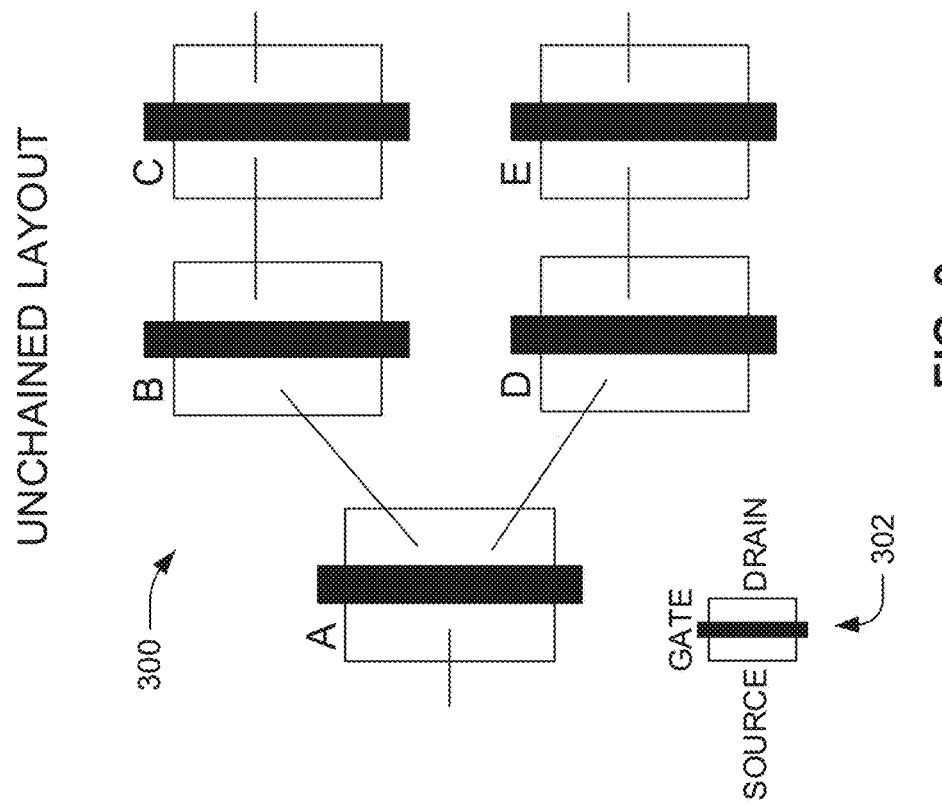
FIG. 3 is an example unchained layout of transistors.

Other figure(s), neighboring the anchor figure(s), can then be shown 204 or, if already given temporary placement within the layout, graphically highlighted 204 to the user via the user interface 104 as candidates for chaining. Immediate connected neighbor figures and/or non-immediate neighbor figures can be highlighted either directly, or indirectly, as shown in FIG. 3, for example, by displaying or highlighting the connections to them. Direct highlighting can take any of a number of forms, such as altering one or more colors or brightnesses of candidate figures, applying a drop-shadow or boldface style to candidate figures, drawing solid- or broken-line bounding boxes (or other shapes) around each candidate figure, animating, blinking, or flashing candidate figures, or combinations of these; other forms of visual highlighting can also be used. Differences in highlighting can also be used to distinguish immediate neighbors from more removed chaining candidates. For example, in a layout consisting of devices A, B, C, and D to be chained, each connected by net to the next in sequence, upon selection of A as the anchor, immediate neighbor B can be highlighted with a first level of brightness, device C can be highlighted with a second level of brightness, and device D can be highlighted with a third level of brightness, e.g., with the further neighbors highlighted in descending order of brightness.

Once candidates for chaining are shown 204, by direct highlighting, indirect highlighting, or otherwise, the incremental chaining 200 can then proceed a number of different ways. In one example, the user selects 206 an immediate neighbor figure among the highlighted candidate figures, for example, with a single mouse click on the immediate neighbor figure, whereupon the selected candidate is automatically abutted to the previously selected anchor figure (or group of already-abutted anchor figures) while preserving the spatial position and orientation of the anchor figure(s). In another example, the user selects 206 a chaining candidate that is not an immediate neighbor to the anchor, but instead is located one or more additional layers more distant in the chain. Alternatively, the user selects 206 multiple chaining candidates in a path with a multiple selection.

Upon any such a selection, automatic chaining 208, including sequential abutment where possible, takes place of the anchor figure(s), the selected candidate figure, and all intervening figures in the chain, again preserving the placement of the anchor figure(s). Accordingly, the incremental chaining can operate on either immediate neighbors, or can be extended to N connections away from an anchor figure. Selection of one or more neighbors N connections away allows fast selection and chaining of figures in a path, freeing the user from having to more laboriously chain each figure in turn. In some examples, chaining 208 preserves any pre-existing chains, whether they have been formed incrementally or existed as a selected anchor. In other examples, this preservation functionality can be user-deactivable, such that the chaining re-chains pre-existing chains. The chaining preserves the placement of the one or more anchor figures. The intervening connected figures, if any, are those in a connectivity path between the one or more anchor figures and the one or more chaining candidate figures according to the connectivity information (e.g., netlist).

With regard to both the selection 202 of anchor figure(s) and the selection 206 of candidate figure(s), for ease of selection, in some example implementations such selection is done via a single-click mouse selection. Other selection methods can also be used, such as area selection (either bounding-box or lasso), Ctrl+click or Shift+click multiple selection, or selection with keyboard commands such as arrow-key navigation and Enter-key or space-bar selection.

Because incremental chaining is user-interactive, at any point in the chaining, the user is given the opportunity to edit 210 figures, e.g., candidate figures or already-chained figures, such that the chaining most closely results in the intended design. Editing 210 figures during incremental chaining allows the user to, for example, alter the shapes and properties of elements in the chain. This can be useful, for example, when the end point of the chain will not otherwise meet a pin figure the position of which is fixed. There are a number of instance parameters, adjustable in the layout tool, that affect the physical realization of an instance. With incremental chaining, the user can intermediarily or remedially alter such parameters or other characteristics of any of the chained or unchained the figures (width, length, curvature, interface angle, etc.) in the chain to accommodate the layout design as it is created. For example, when Virtuoso is used as the layout design tool, the Virtuoso property editor or property editing assistants can be invoked to alter parameters of figures; editable properties define the behavior or form of the figures. The particular parameters that can be edited depend upon the particular library element being chained; each library element may have different editable characteristics that correspondingly modify the represented circuit element in different ways.

The incremental nature of the chaining is indicated by loop 212 between the automated chaining operation 208 and the connected-figure showing (or highlighting) operation 204. As soon as figures have been chained (and abutted where possible), additional candidates for chaining are shown or highlighted 204 immediately, permitting to user to chain again 208 simply by making another selection 206, as by a single mouse click. Alternatively, the user can take the opportunity after chaining to intervene by editing 210 figures, an intervention that, as noted previously, cannot be done in the middle batch-mode chaining.

FIGS. 3-10 and 11-13 respectively illustrate electronics and photonics examples of incremental chaining to demonstrate the user-interactivity advantages of the process under the different design regimes. As discussed previously, incremental chaining offers the control of interactive abutment without the need to physically drag figures together by exploiting connectivity information, guiding the user without restricting the choice of solution in the way batch-mode chaining would.

Figure 4:
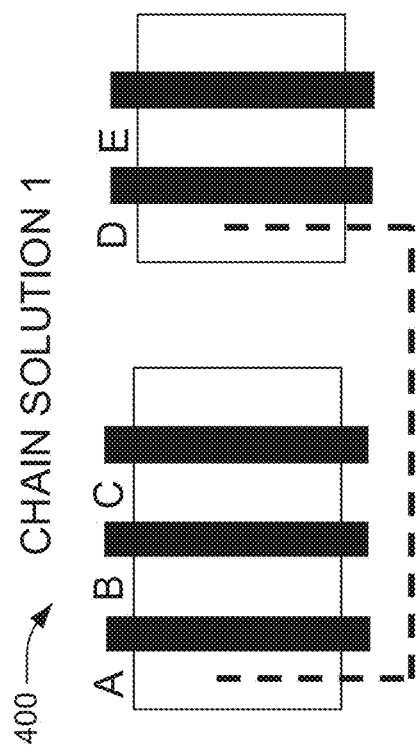
FIG. 4 is a first example solution for the layout of FIG. 3.
Figure 5:
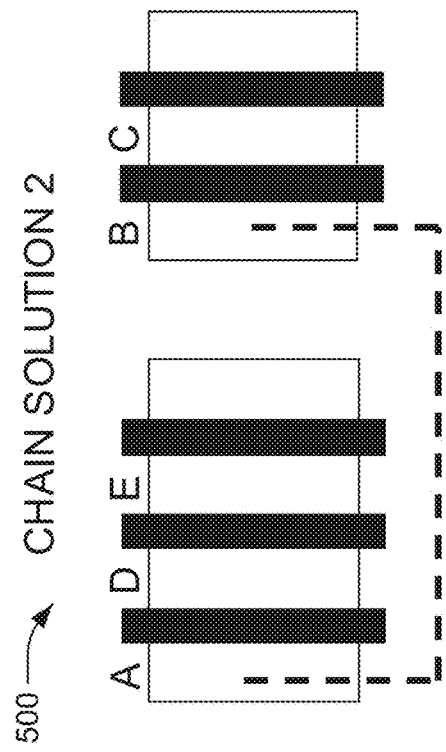
FIG. 5 is a second example solution for the layout of FIG. 3.

FIG. 3 shows an unchained layout 300 of five transistors A, B, C, D, and E. Thin, unbroken lines connecting the transistors represent the nets, or logical connections, between these devices. The net lines do not represent routing, e.g., physical connections between devices in the layout. Example-transistor legend 302 shows the relationship between gate, source, and drain in each transistor. Notably, the drain of transistor A is connected, in branching fashion, to both the source of transistor B and the source of transistor D. Given the connectivity between the transistors as represented by the nets, as shown by FIGS. 4 and 5, two different chaining solutions 400, 500 could be derived by fully-automated batch-mode chaining for the topology of unchained layout 300. In each of these drawings, the broken line represents a wire (e.g., a routed net). In chaining solution 400, transistors A, B, and C are abutted as a first chain, transistors D and E are separately abutted as a second chain, and transistor A is connected to transistor D by wire. In chaining solution 500, transistors A, D, and E are abutted as a first chain, transistors B and C are separately abutted as a second chain, and transistor A is connected to transistor B by wire. It may be the case that user desires or expects one of these solutions, but batch-mode chaining, over which the user has no interactive control, produces the other of the solutions, in which case, incremental chaining permits finer user control over the evolution of the chaining solution and allows the user to produce the desired or expected chaining solution.

Figure 6:
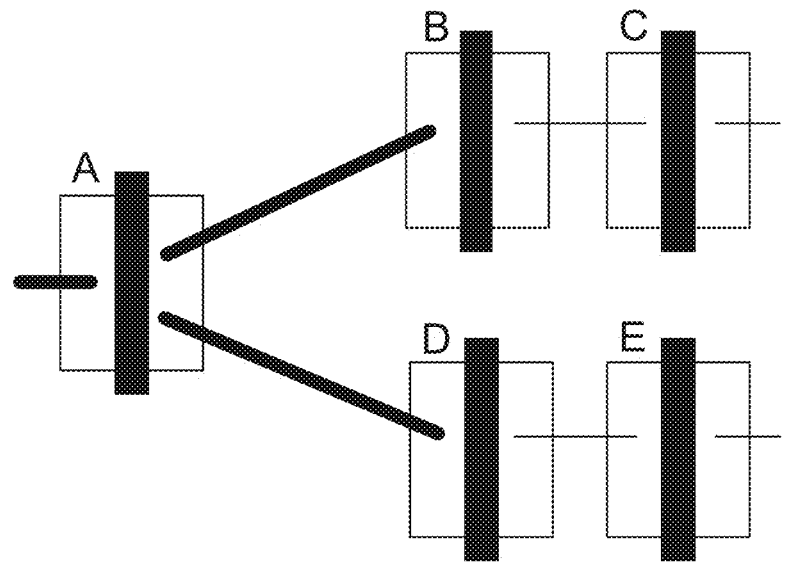
FIGS. 6-10 show an example of incremental chaining to achieve the solution of FIG. 5.
Figure 7:
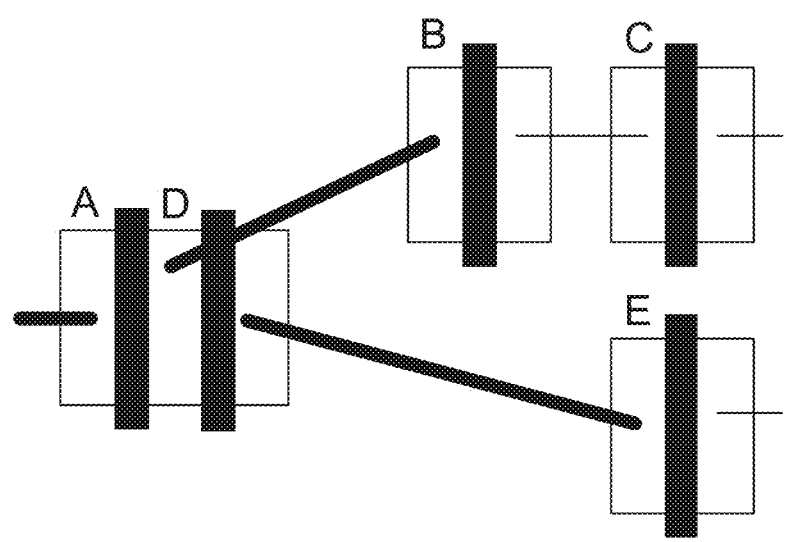

Supposing that the user desires or expects solution 500, the user can select (e.g., with a single mouse click) transistor A as an anchor, then successively select (e.g., with respective single mouse clicks) transistors D and E, or, alternatively, can simply select transistor E (e.g., with a single mouse click) or transistors D and E together (e.g., with a Ctrl+click or Shift+click multiple selection, or a box or lasso area selection) to produce the desired A-D-E chain before proceeding to successively select transistors B and C (or, equivalently, only transistor C) to produce the second B-C chain. FIG. 6 illustrates the highlighting 204 of nets between transistors A and B, and transistors A and D, following initial selection 202 of transistor A as an anchor figure. In the illustrated user interface example, nets between transistors A and B, and transistors A and D, have been thickened in order to highlight transistors B and D as incremental chaining candidates. Illustrating the condition after the user has selected 206 transistor D and chaining 208 has automatically executed to abut transistors A and D, FIG. 7 likewise illustrates the highlighting 204 of nets between transistors D and E, and transistors A and B, in the same fashion, by thickening the nets. In the illustrated example, if the user selects 206 transistor B at this point, a new chain will be formed, as transistor B is unable to be chained to transistor A, because transistor A is already chained to transistor D.

Figure 8:
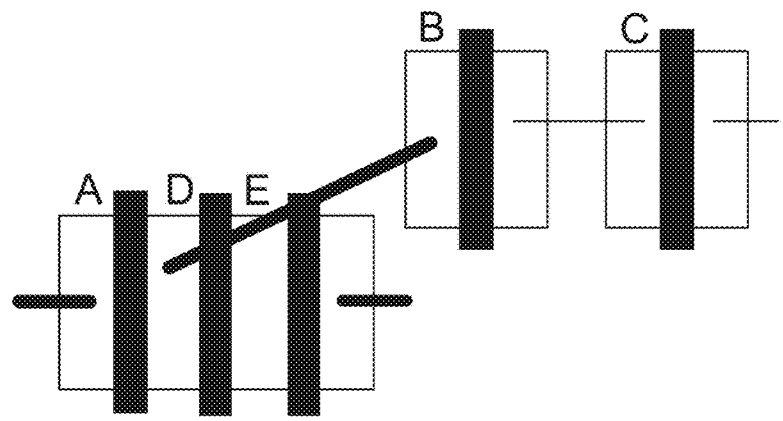
Figure 9:
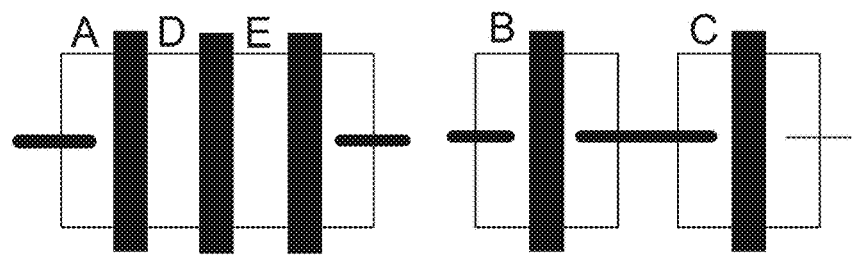
Figure 10:
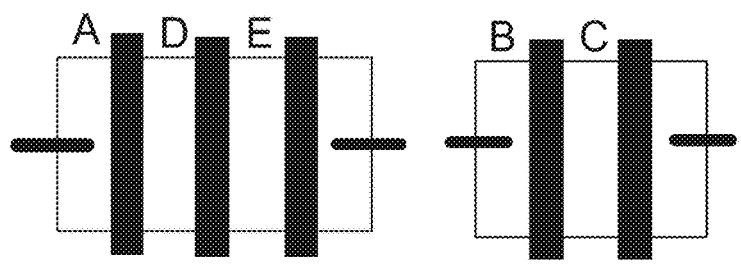

FIG. 8 illustrates the highlighting 204 following the user selection 206 of transistor E and its chaining 208 to the A-D abutment to form chain A-D-E. It remains the case that if the user selects 206 transistor B at this point, a new chain will be formed, as transistor B is still unable to be chained to transistor A. FIG. 9 illustrates the highlighting 204 following the user selection 206 of transistor B and the start of its new chain. Upon user selection 206 of transistor C, transistor C is chained 208 to transistor B, resulting in the configuration shown in FIG. 10. The placement phase 214 then being completed for this example, a routing phase 216 would then add the wire between transistor A and transistor B to obtain the solution 500 shown in FIG. 5. In the placement phase 214, each selection 206 in FIGS. 6-10 adds a figure to a chain, and each selection can require as little user input as a single mouse click. Notably, the step of FIG. 7 can be omitted entirely if the user selects the figure of transistor E directly rather than selecting transistor D first.

Figure 11:
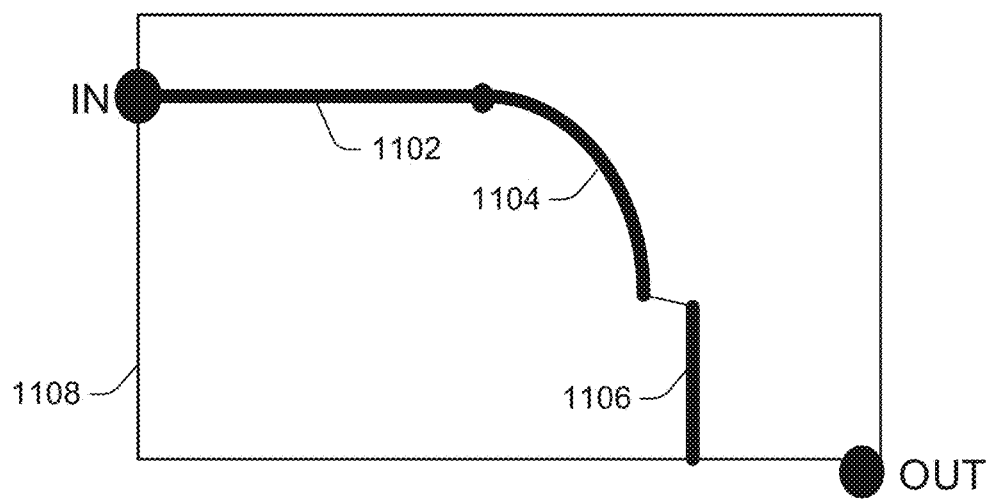
FIGS. 11-13 show an example of incremental chaining including user-interactive editing of layout figure parameter(s) in a photonics device context.
Figure 12:
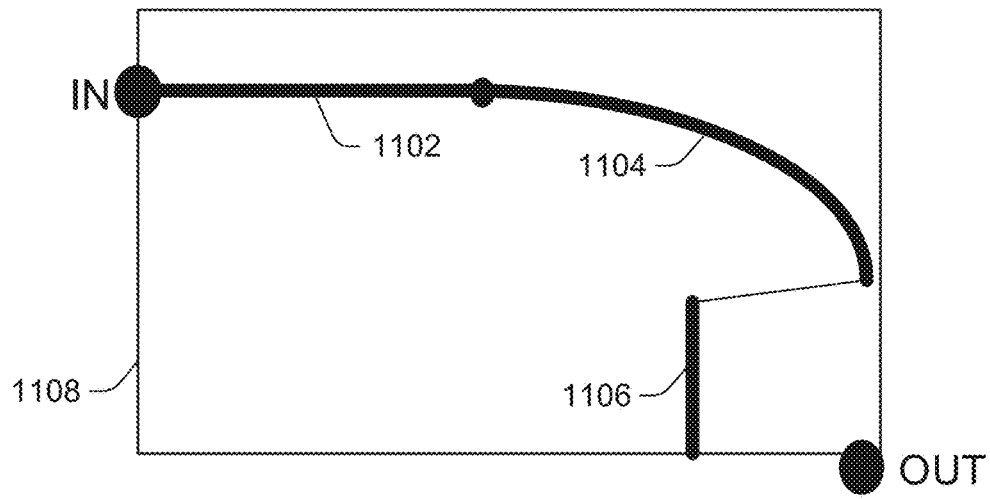
Figure 13:
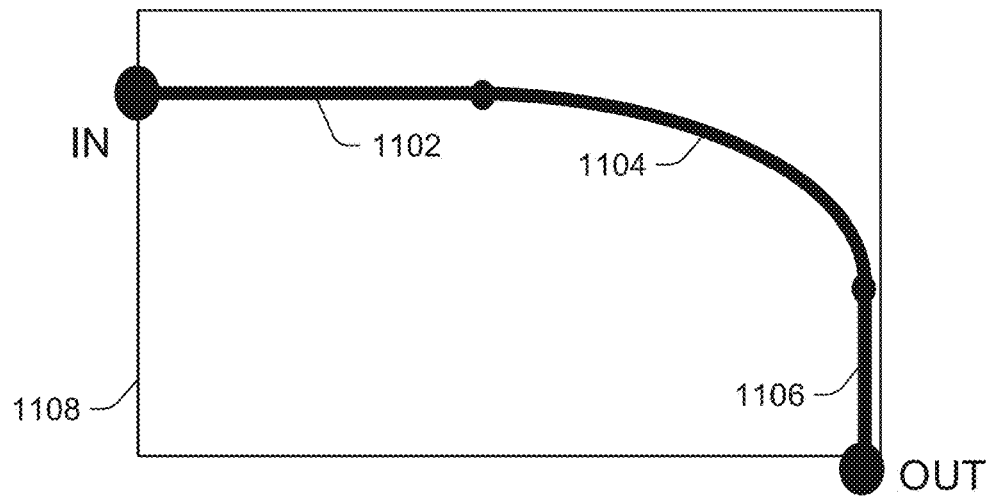

Top-level pins in any circuit (e.g., photonic pins, in a photonic design example) define effectively the interface to the circuit being designed, and the position of those pins is something that the circuit designer may wish to choose himself or herself. Incremental chaining allows a user to first define the locations of top-level pins and then choose to incrementally build one or more chains from one top-level pin to another (or to multiple others) by selecting the starting top-level pin as an anchor. FIGS. 11-13 illustrate a photonics example of such pin-centric incremental chaining design, highlighting the user ability to edit figures during incremental chaining to arrive at a guided layout solution. In these drawings, a photonics design undergoing layout design includes an input interface pin IN and an output interface pin OUT, of fixed position, intended to be connected by three photonic waveguides 1102, 1104, 1106 within device boundary 1108. The thin line between waveguides 1104 and 1106 is a net indicative of their topological connectivity, but does not mean that the two devices are physically mated as they would need to be in a functional photonics layout.

In the layout diagram of FIG. 11, a partial chain has been constructed from input pin IN and through photonic waveguides 1102 and 1104. However, this partial chain is on target to be misaligned, e.g., if completed by chaining 208 waveguide 1106 with waveguide 1104, waveguide 1106 will not end the chain at fixed-position output pin OUT as intended by the user. Accordingly, as shown in FIG. 12, prior to selecting 206 and chaining 208 waveguide 1106 (e.g., by clicking on it during the incremental chaining process), the circuit designer performs editing 210 to adjust the parameters of photonic waveguide 1104, specifically, to choose a new curvature for waveguide 1104, such that when the incremental chaining is completed in FIG. 13 by chaining waveguide 1106 to waveguide 1104, the other end of waveguide 1106 correctly terminates in output pin OUT. Thus, with incremental chaining, the user is able to intervene in the design when the user starts to see the layout going wrong.

The incremental chaining systems and methods of the present application provide a variety of benefits over batch-mode approaches to chaining. The incremental chaining of the present application uses net connectivity to intuitively guide the user on possible abutment candidates connected to any abutment interface or side of the one or more anchored figures. Thus, chains may grow in any direction. The incremental chaining of the present application also eliminates the need to repeatedly manually move to abut, by using a click-to-select iterative enter-function approach. The incremental chaining of the present application further avoids batch-mode chaining which can be un-intuitive and may alter the position of already-placed figures. Still further, the incremental chaining of the present application can be used in combination with two-dimensional any-angle chaining algorithms and batch-mode chaining, such as for chaining photonics devices (such as optical waveguides), radio-frequency (RF) devices (such as RF transmission lines), and complementary metal-oxide-semiconductor (CMOS) devices.

The incremental chaining systems and methods of the present application also provide the following additional novel features. In addition to selecting candidates which are connected to the chain under construction, incremental chaining provides the potential to allow selection of figures that, although not immediately connected, could be candidates further along the chaining process. This allows an anchor A, for example, to be chained with figures B and C, with a single user selection (e.g., a single user mouse-click) of only the end figure C, to form the compete chain A-B-C, the intermediate figure B (and any other intermediate figures) being deduced. Interactive incremental chaining also offers the potential for automatically matching orientations, widths, and other figure parameters or characteristics to support abutment as the chaining progresses.

The appropriate chaining algorithm for the figures involved (e.g., based on the technology regime being designed in—whether CMOS, RF, photonics, or otherwise) is repeatedly called on the identified set of figures, within an enter function. The one or more figures initially selected, and their abutted neighbor figures, are treated as an anchor. The resulting chain is positioned such that anchored instances are placed at their original positions.

Chaining according to the systems and methods described herein is incremental and intuitive. It guides the selection of chaining candidates, working with the user while chaining is performed. Incremental chaining thus respects single anchors and multiple anchored figures connected by abutment to form an anchored cluster. It allows chains to form in any direction growing out from the anchored figures. Incremental chaining can support user selection of either a single anchor figure or connected group of anchored figures. The incremental chaining examples described herein can also be adapted to support multiple independent anchors that are not linked by connectivity.

Incremental chaining according to the systems and methods described herein provides a user-interface framework that can utilize existing chaining algorithms developed for CMOS, RF, photonics, and other technologies and that can be less destructive than batch-mode chaining, when some of the design has already been partially placed. Incremental chaining is intuitive because the designer can easily control the anchor around which the chain will grow. It is incremental and involves less mouse travel with only a single selection operation, e.g., only a single mouse-click, being required to select a figure and add it to the figures to be chained. The ability to intervene in a design mid-chaining has usability advantages over batch-mode chaining.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A method, implemented on a computer, for interactive incremental chaining of circuit devices in an integrated circuit, the method comprising:
receiving one or more files containing database records of a plurality of circuit layout figures, including circuit devices and/or pins, and connectivity information comprising a plurality of nets interconnecting at least a portion of the plurality of circuit layout figures;
selecting with a graphical user interface one or more circuit layout figures, placed on a layout canvas rendered by the graphical user interface, as one or more anchor figures;
highlighting on the graphical user interface one or more chaining candidate figures from among the plurality of circuit layout figures directly or indirectly connected with the one or more anchor figures, based on the connectivity information and the selection of the one or more anchor figures;
responsive to a selection with the graphical user interface of one or more of the chaining candidate figures, chaining, by the computer, the selection of the one or more chaining candidate figures with the one or more anchor figures by sequentially abutting the selection of the one or more chaining candidate figures and any intervening connected figures with the one or more anchor figures;
after the chaining, repeating the highlighting, the selection of chaining candidate figures, and the chaining to progressively build and place on the layout canvas one or more chains of the plurality of circuit layout figures.

2. The method of claim 1, further comprising, after the highlighting, the chaining, the repeated highlighting, or the repeated chaining, editing, by a user, one or more parameters of one or more of the circuit layout figures.

3. The method of claim 2, wherein the edited one or more parameters comprise at least one of width, length, curvature, or interface angle of one of the plurality of circuit layout figures.

4. The method of claim 1, wherein at least one of the circuit layout figures is represented by a pcell instance.

5. The method of claim 1, wherein at least one of the circuit layout figures is a radio frequency (RF) transmission line.

6. The method of claim 1, wherein at least one of the circuit layout figures is an optical waveguide.

7. The method of claim 1, wherein the selected one or more anchor figures comprise a top-level pin.

8. The method of claim 1, further comprising, upon completion of the building and placement of the one or more chains, a routing phase placing wires connecting circuit layout figures in different placed chains of circuit layout figures based on the connectivity information.

9. The method of claim 1, wherein the repeated user selection of one or more chaining candidate figures results in starting a second of the one or more chains, based on the repeated user-selected one or more chaining candidate figures not being abuttable to a first of the one or more chains.

10. A system for user-interactive incremental chaining of circuit devices in an integrated circuit, the system comprising:
one or more computers comprising a non-transitory machine-readable media configured to store one or more files containing database records of a plurality of circuit layout figures, including circuit devices and/or pins, and connectivity information comprising a plurality of nets interconnecting at least a portion of the plurality of circuit layout figures;
at least one computer of the one or more computers, the at least one computer coupled to the non-transitory machine-readable media storing the one or more files and comprising a processor configured to:
permit a user to select one or more circuit layout figures, placed on a layout canvas rendered by a graphical user interface, as one or more anchor figures;
highlight, on the graphical user interface, one or more chaining candidate figures from among the plurality of circuit layout figures directly or indirectly connected to the one or more anchor figures, based on the connectivity information and the user selection of the one or more anchor figures;
permit the user to select one or more of the chaining candidate figures;
responsive to the user selection of the one or more of the chaining candidate figures, automatically chain the selected one or more chaining candidate figures with the one or more anchor figures by sequentially abutting the selected one or more chaining candidate figures and any intervening connected figures with the one or more anchor figures, the chaining preserving the placement of the one or more anchor figures, the intervening connected figures being in a connectivity path between the one or more anchor figures and the one or more chaining candidate figures according to the connectivity information;
after the automatic chaining, user-interactively repeat the highlighting, the user selection of chaining candidate figures, and the automatic chaining to progressively build and place on the layout canvas one or more chains of the plurality of circuit layout figures.

11. The system of claim 10, wherein the processor is further configured to, after the highlighting, the chaining, the repeated highlighting, or the repeated chaining, permit the user to edit one or more parameters of one or more of the circuit layout figures.

12. The system of claim 11, wherein the edited one or more parameters comprise at least one of width, length, curvature, or interface angle of one of the plurality of circuit layout figures.

13. The system of claim 10, wherein at least one of the circuit layout figures is represented by a pcell instance.

14. The system of claim 10, wherein at least one of the circuit layout figures is a radio frequency (RF) transmission line.

15. The system of claim 10, wherein at least one of the circuit layout figures is an optical waveguide.

16. The system of claim 10, wherein the selected one or more anchor figures comprise a top-level pin.

17. The system of claim 10, wherein the processor is further configured to, upon completion of the building and placement of the one or more chains, place wires connecting circuit layout figures in different placed chains of circuit layout figures based on the connectivity information.

18. The system of claim 10, wherein the repeated user selection of one or more chaining candidate figures results in starting a second of the one or more chains, based on the repeated user-selected one or more chaining candidate figures not being abuttable to a first of the one or more chains.

19. One or more non-transitory computer-readable media storing instructions that when executed by a computer processor, the processor in communication with one or more files containing database records of a plurality of circuit layout figures, including circuit devices and/or pins, and connectivity information comprising a plurality of nets interconnecting at least a portion of the plurality of circuit layout figures, cause the processor to:

render a layout canvas on a graphical user interface;

permit a user to select one or more circuit layout figures, placed on the layout canvas, as one or more anchor figures;

highlight, on the graphical user interface, one or more chaining candidate figures from among the plurality of circuit layout figures directly or indirectly connected to the one or more anchor figures, based on the connectivity information and the user selection of the one or more anchor figures;

permit the user to select one or more of the chaining candidate figures;

responsive to the user selection of the one or more of the chaining candidate figures, automatically chain the selected one or more chaining candidate figures with the one or more anchor figures by sequentially abutting the selected one or more chaining candidate figures and any intervening connected figures with the one or more anchor figures, the chaining preserving the placement of the one or more anchor figures, the intervening connected figures being in a connectivity path between the one or more anchor figures and the one or more chaining candidate figures according to the connectivity information;

after the automatic chaining, user-interactively repeat the highlighting, the user selection of chaining candidate figures, and the automatic chaining to progressively build and place on the layout canvas one or more chains of the plurality of circuit layout figures.

20. The one or more computer-readable media of claim 19, the instructions further causing the processor to, after the highlighting, the chaining, the repeated highlighting, or the repeated chaining, permit the user to edit one or more parameters of one or more of the circuit layout figures.

\* \* \* \* \*